United States Patent
Coronel et al.

(10) Patent No.: US 6,281,068 B1
(45) Date of Patent: Aug. 28, 2001

(54) METHOD FOR BURIED PLATE FORMATION IN DEEP TRENCH CAPACITORS

(75) Inventors: Philippe Coronel, Massy; David Cruau, Villabe; Francois Leverd, Cesson; Renzo Maccagnan, Villabe; Eric Mass, Paris, all of (FR)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/291,453

(22) Filed: Apr. 14, 1999

(30) Foreign Application Priority Data

Apr. 30, 1998 (EP) .................................................. 98480028

(51) Int. Cl.[7] .............................................. H01L 21/8242
(52) U.S. Cl. ..................... 438/243; 438/244; 438/246; 438/249; 438/386; 438/387; 438/389; 438/392; 438/433; 438/434; 438/436; 438/437; 438/438
(58) Field of Search .................................. 438/243, 244, 438/246, 249, 386, 387, 389, 392, 433, 434, 436, 437, 438

(56) References Cited

U.S. PATENT DOCUMENTS

| | | | |
|---|---|---|---|
| 5,336,912 | * 8/1994 | Ohtsuki | 257/304 |
| 5,618,751 | * 4/1997 | Golden et al. | 438/392 |
| 5,629,226 | * 5/1997 | Ohtsuki | 438/389 |
| 6,001,684 | * 12/1999 | Shen | 438/246 |
| 6,008,103 | * 12/1999 | Hoepfner | 438/386 |
| 6,100,130 | * 8/2000 | Iba et al. | 438/243 |
| 6,107,135 | * 8/2000 | Kleinhenz et al. | 438/249 |

* cited by examiner

Primary Examiner—John F. Niebling
Assistant Examiner—Lynne A. Gurley
(74) Attorney, Agent, or Firm—Robert A. Walsh (57) ABSTRACT

An improved method of forming the buried plate regions in deep trench capacitors used in DRAM memory semiconductor circuits in which the polymer used in the deep trench is etched down to the desired depth in a reactive ion etch tool using an $O_2/CF_4$ chemistry. Since optical/interferometric etch end-point detection system can be used to monitor the etch back step in its totality, the quantity of the polymer remaining in deep trenches can be very accurately controlled, which in turn will produce a well controlled buried plate region during the out-diffusion step of the arsenic dopant contained in the arsenic doped silicon glass layer.

6 Claims, 11 Drawing Sheets

METHOD FOR BURIED PLATE FORMATION IN DEEP TRENCH CAPACITORS

FIELD OF INVENTION

The present invention relates to the manufacture of semiconductor integrated circuits (Ics) and more particularly to an improved method for forming the buried plate regions in deep trench capacitors of DRAM memory chips.

BACKGROUND OF THE INVENTION

Deep trenches are extensively used in the manufacture of semiconductor integrated circuits, in particular of 64 and 256 Mb DRAM memory chips to define the storage capacitors. Basically, a deep trench is formed in a doped silicon substrate, then a dielectric film is conformally deposited thereon to coat the entire interior surface of the trench and finally the trench is filled with doped polysilicon. This doped silicon/dielectric film/doped polysilicon forms the storage capacitor. In order to keep an acceptable capacitor value in spite of continuous capacitor size reduction, the thickness of the capacitor dielectric film is constantly reduced. In turn, the voltage across dielectric film must be drastically reduced to avoid undesired breakdown voltage effects. In order to achieve this voltage reduction, a doped area is created around the bottom of the storage capacitor. This area is commonly referred to as the "buried plate" in the technical literature. At this stage of a conventional fabrication process of such DRAM chips, the starting structure (which is a part of a wafer) consists of a silicon substrate coated with silicon oxide and silicon nitride pad layers having deep trenches formed therein. Difficulties have been experienced in forming the buried plate in the deep trenches.

SUMMARY OF THE PRESENT INVENTION

It is therefore a primary object of the present invention to provide an improved method for buried plate formation in deep trench capacitors.

It is another object of the present invention to provide an improved method for buried plate formation in deep trench capacitors that uses a polymer having high filling/planarizing capability and is RIE etchable instead of the standard photoresist material.

It is another object of the present invention to provide an improved method for buried plate formation in deep trench capacitors that allows a very accurate control of the polymer etch back step which is essential to the whole chip fabrication process.

It is another object of the present invention to provide an improved method for buried plate formation in deep trench capacitors which does not require the use of a CDE tool to perform the standard photoresist etch back step.

It is another object of the present invention to provide an improved method for buried plate formation in deep trench capacitors wherein the polymer is RIE etched back for greater etch uniformity, wafer to wafer and lot to lot.

It is still another further object of the present invention to provide an improved method for buried plate formation in deep trench capacitors wherein the polymer etch back step is monitored by optical/interferometric techniques.

The accomplishment of these and other related objects is achieved by the method of the present invention which aims to get rid of the drawbacks of the prior art buried plate formation process. According to the present invention, there is disclosed an improved method that is based on the combined use of a new filling/planarizing medium and a new etch back process.

The starting structure is state-of-the-art and consists of a silicon substrate coated by a patterned $SiO_2$ $SiN_4$ pad layer to define deep trenches formed therein by etching. The interior walls of said deep trenches are coated with an arsenic-doped silicon glass (ASG) layer and an overlying $SiO_2$ passivation layer that are conformally deposited onto the structure as standard.

Now, at this stage of the conventional buried plate formation process, a polymer having high filling/planarization capability on the one hand and being RIE etchable on the other hand, such as the polymer references ACCUFLO T-13EL, manufactured by ALLIEDSIGNAL, Inc., Sunnyvale, Calif., USA, is used to replace the photoresist material. This polymer is deposited to fill the deep trenches in excess and then baked to leave a layer having a very planar surface above the silicon substrate.

The polymer is then etched in a RIE tool using an $O_2/CF_4$ chemistry. Because now an optical/interferometric etch end point detection system can be used to monitor the etch back step in its totality, the quantity of the polymer remaining in deep trenches can be thus very accurately controlled, which in turn will produce a well controlled buried plate region during the out diffusion step of the arsenic dopant contained in the ASG layer.

The novel features believed to be characteristic of this invention are set forth in the appended claims. The invention itself, however, as well as these and other objects and advantages thereof, will be best understood by reference to the following detailed description of an illustrated preferred embodiment to be read in conjunction with the accompanying drawings.

DESCRIPTION OF A PREFERRED EMBODIMENT

The buried plate formation process specifically includes the eight basic steps recited below.

(1) Depositing a conformal layer of arsenic-doped silicon glass (ASG) onto the structure.
(2) Depositing a conformal layer of $SiO_2$ atop said ASG layer.
(3) Filling the deep trenches with a photoresist layer.
(4) Removing the photoresist material down to a given depth into deep trenches.
(5) Removing $SiO_2$ and ASG materials from unprotected areas.

(6) Stripping remaining photoresist layer from the bottom of deep trenches.
(7) Out-diffusing arsenic from the ASG layer into the silicon substrate.
(8) Finally, removing $SiO_2$ and ASG materials from the bottom of deep trenches.

All these processing steps are conducted in the Deep Trench Module.

Figure 1:
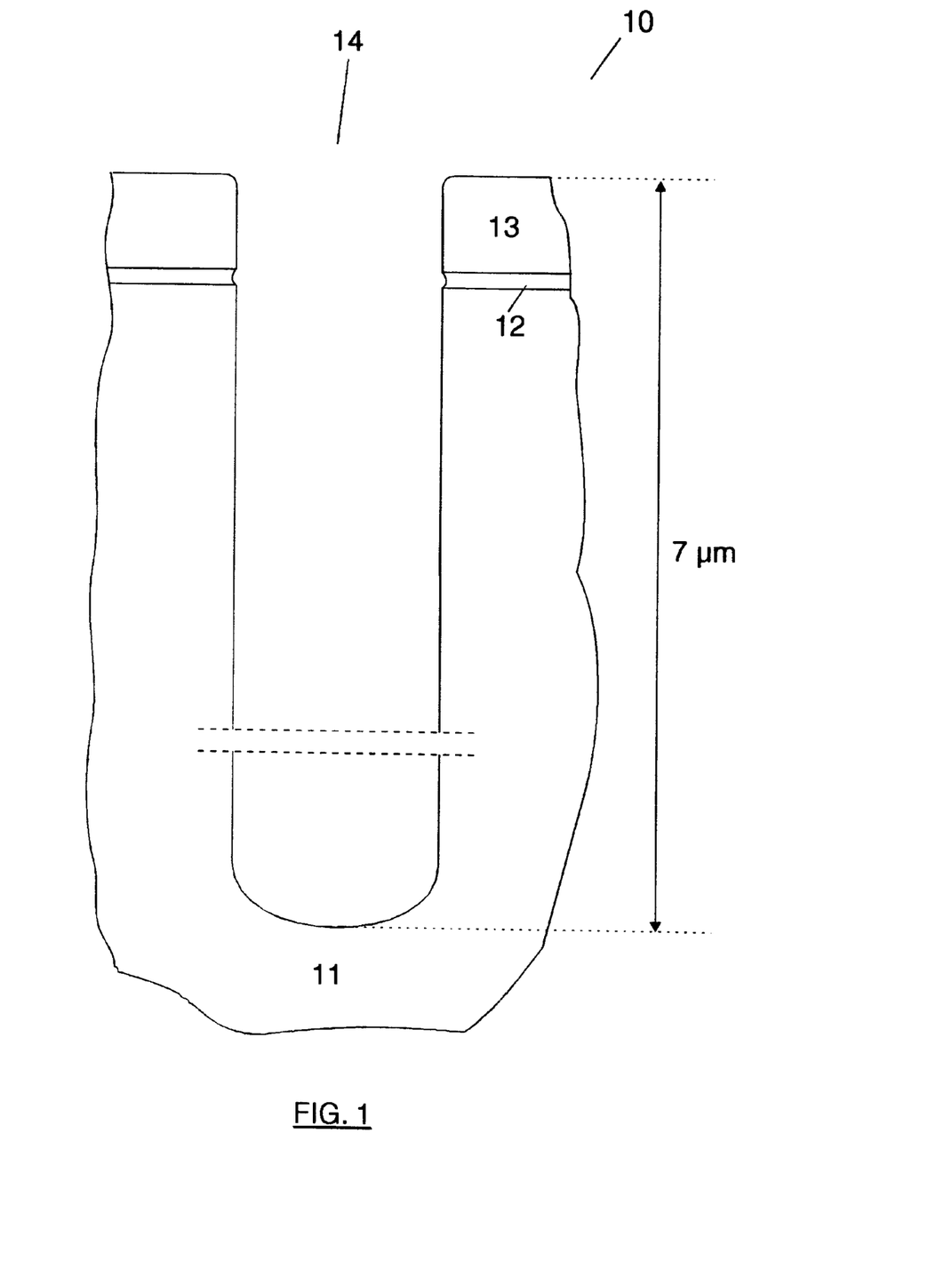
FIGS. 1 to 8 show a structure consisting of a silicon substrate provided with deep trench undergoing the essential steps of the buried plate formation process.

FIG. 1 schematically illustrates the starting structure mentioned above bearing numeral 10 consisting of a P-type silicon substrate 11 with a 10 nm thick silicon oxide ($SiO_2$) and a 220 nm thick silicon nitride ($Si_3N_4$) layers respectively referenced 12 and 13 formed thereon. These layers will be referred to hereinbelow as the $SiO_2/Si_3N_4$ pad layer 12/13. The structure 10 is provided with a deep trench 14 formed therein as standard. Typically, the trench 14 has a depth of about 7 um and an oblong section of about 500×350 nm at the substrate surface.

Figure 2:
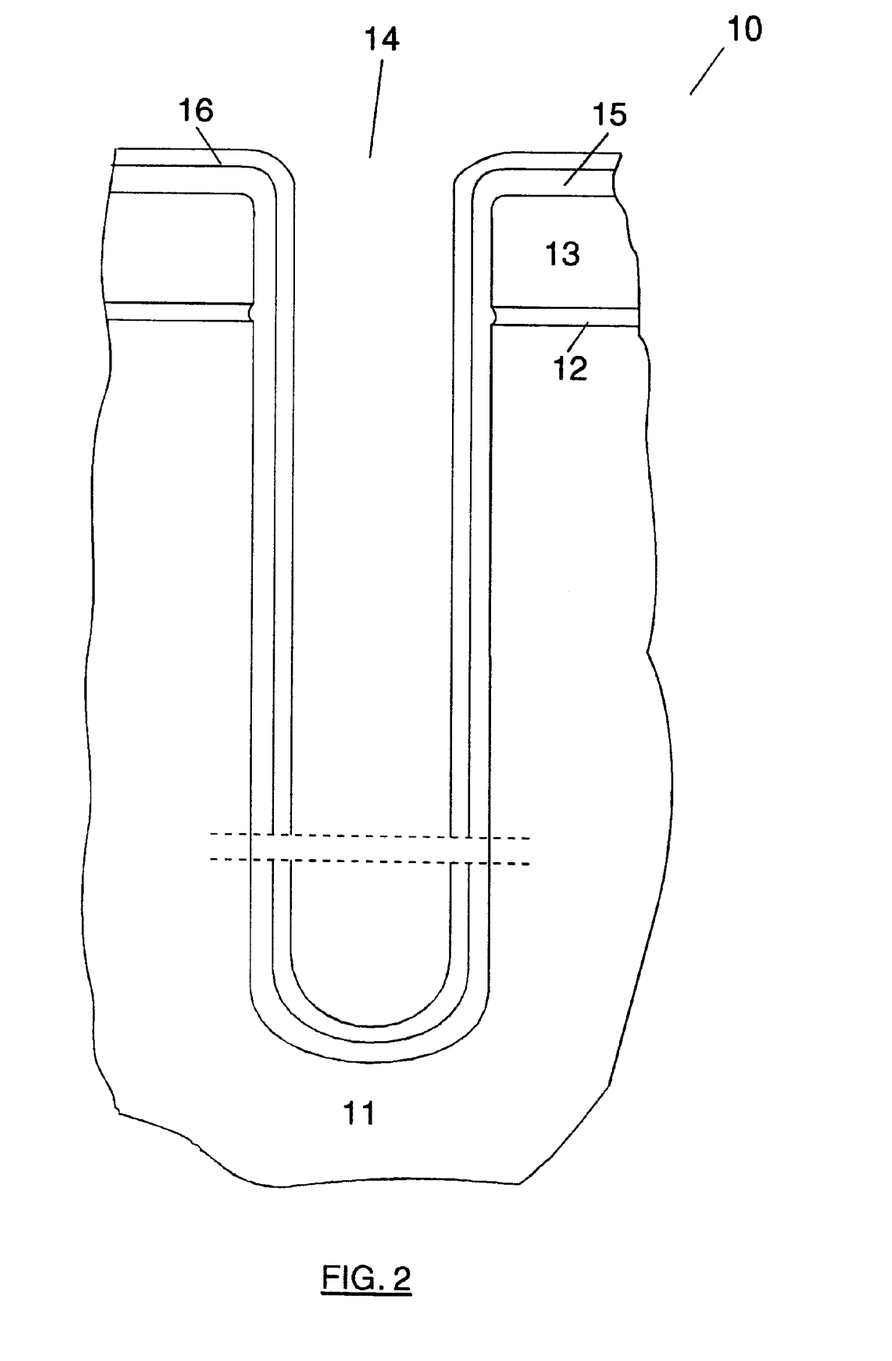

Now turning to FIG. 2, a 45 nm thick arsenic heavily doped silicon glass (ASG) layer 15 is conformally deposited atop the structure, followed by the conformal deposition of a 20 nm thick $SiO_2$ layer 16 by LPCVD. As known for those skilled in the art, arsenic is an N type dopant.

Figure 3:
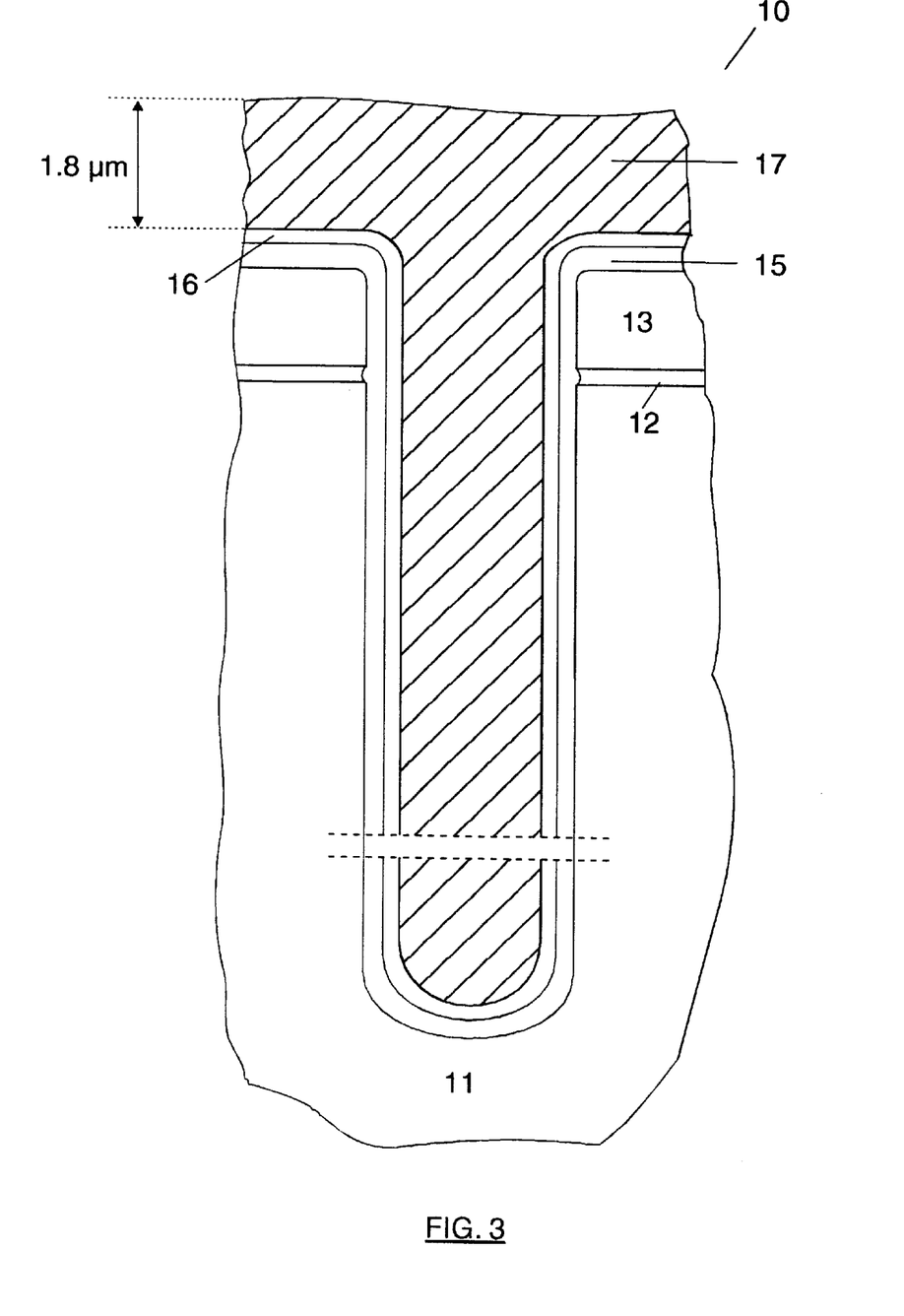

Now, a 1.8 um thick layer 17 of a filler medium, typically a photoresist, is conformally deposited onto the structure in order to fill the deep trench 14 in excess. A photoresist such as AZ7511 manufactured by CLARIANT, Brunswick, N.Y., USA, is adequate in that respect. After reflow, photoresist layer 17 has a coarsely planar surface as shown in FIG. 3.

Figure 4:
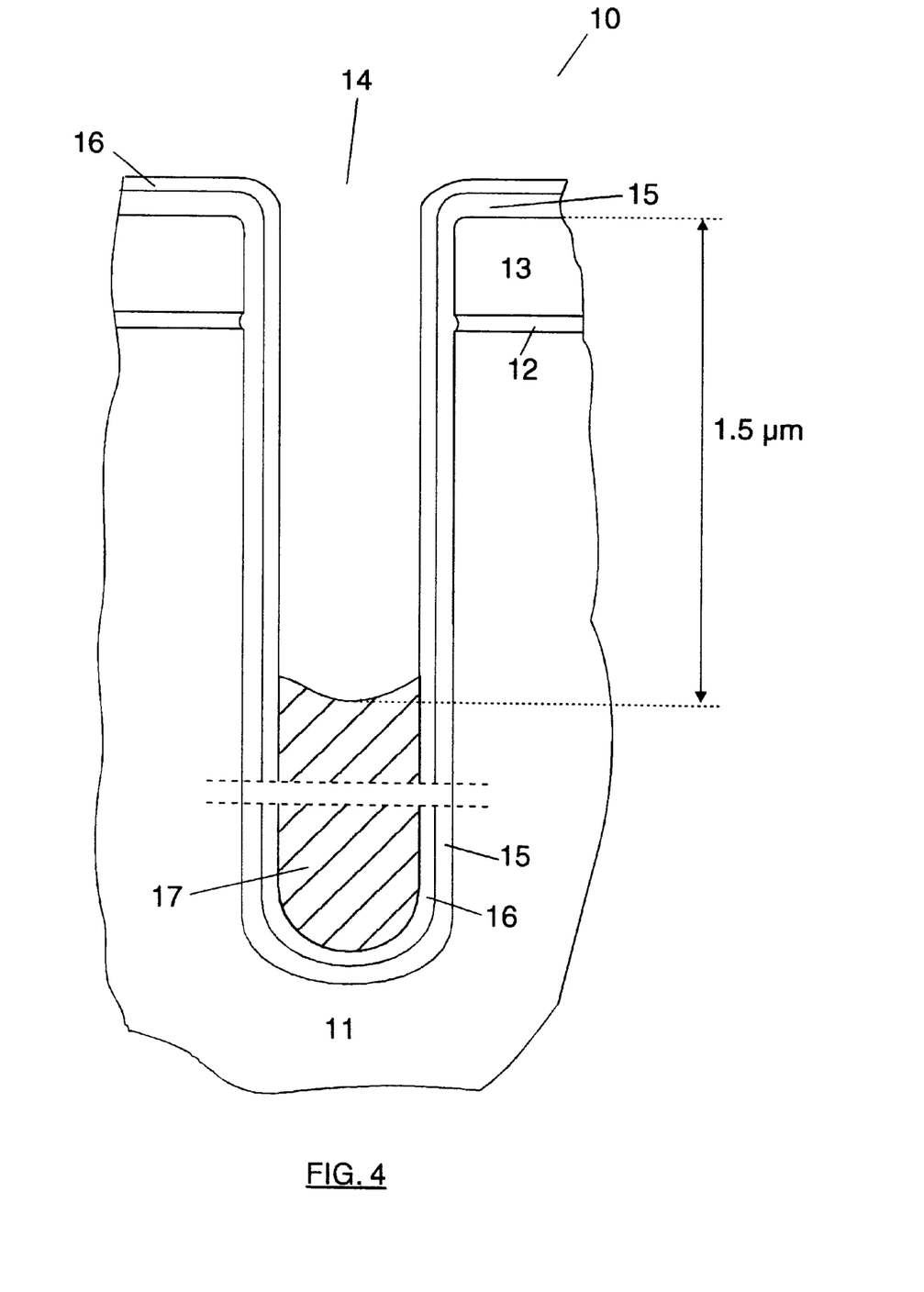

After photoresist planarization was performed, a given amount of the resist material forming layer 17 must be removed, so that the resist surface stands at about 1.5 micron below the structure 10 surface as shown in FIG. 4. To that end, the resist material is exposed and developed by means of a conventional lithographic process. However, this technique tends to be abandoned today because it is more and more difficult to expose the resist material at the bottom of the trench through the very minute oblong-shaped opening mentioned above. Another technique which consists in etching the resist material by means of a Chemical Downstream Etcher (CDE) tool such as the Shibaura CDE-80 manufactured by SHIBAURA, Zama-Shi, Japan, becomes now of common usage in the semiconductor industry. At this stage of the conventional buried plate formation process, the structure 10 is shown in FIG. 4. The remaining photoresist of layer 17 exhibits a typical recessed shape at its upper surface in trench 14.

Figure 5:
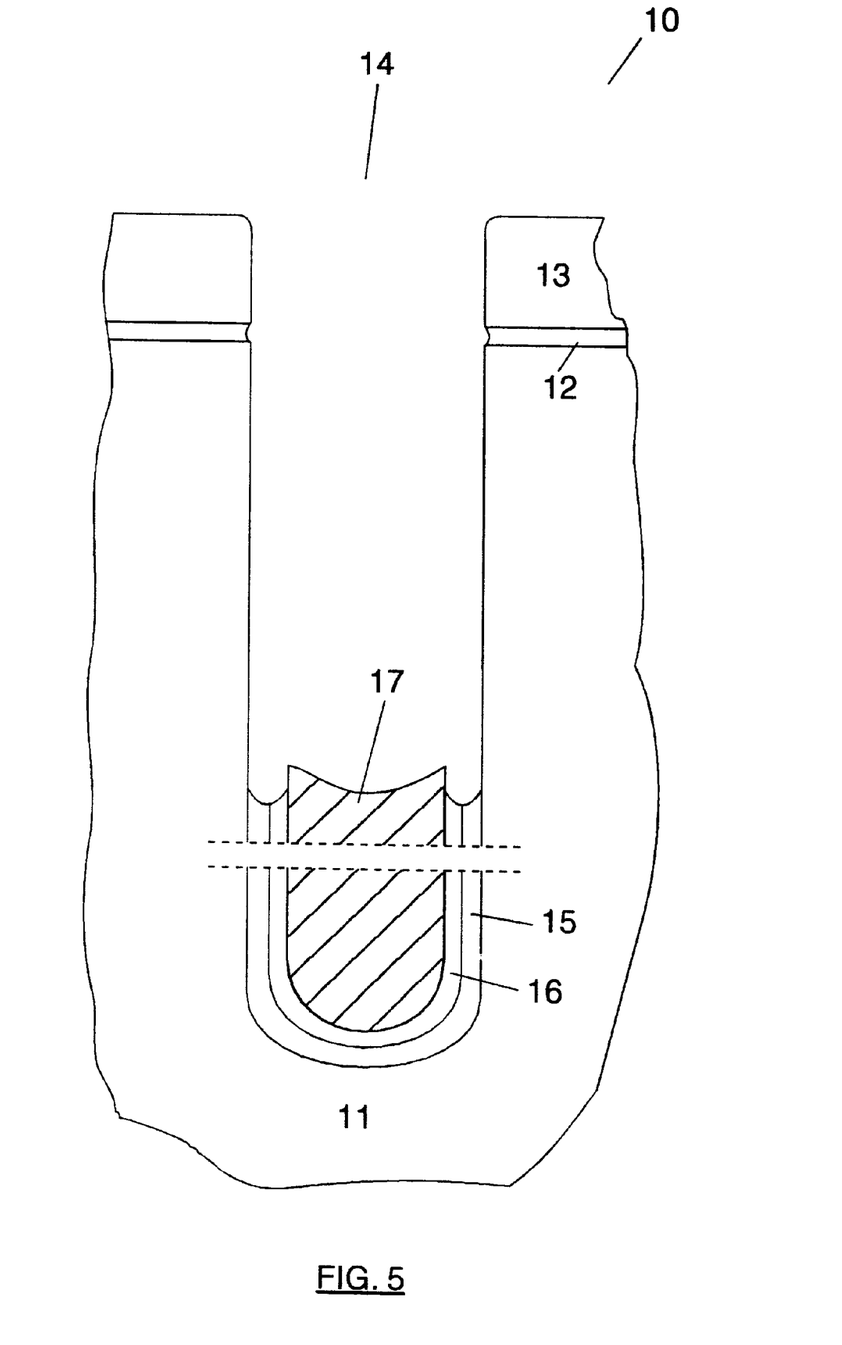
Figure 6:
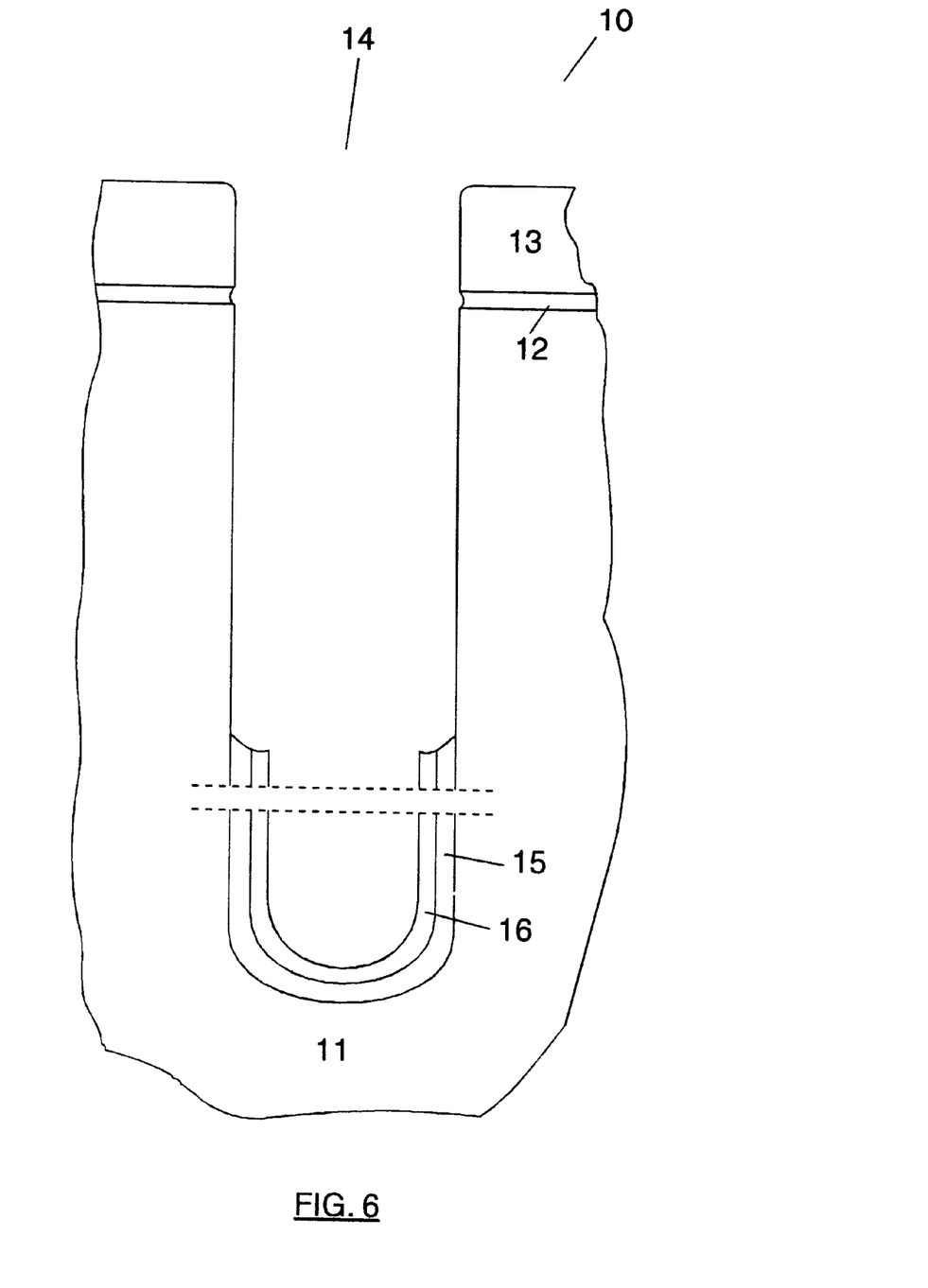
Figure 7:
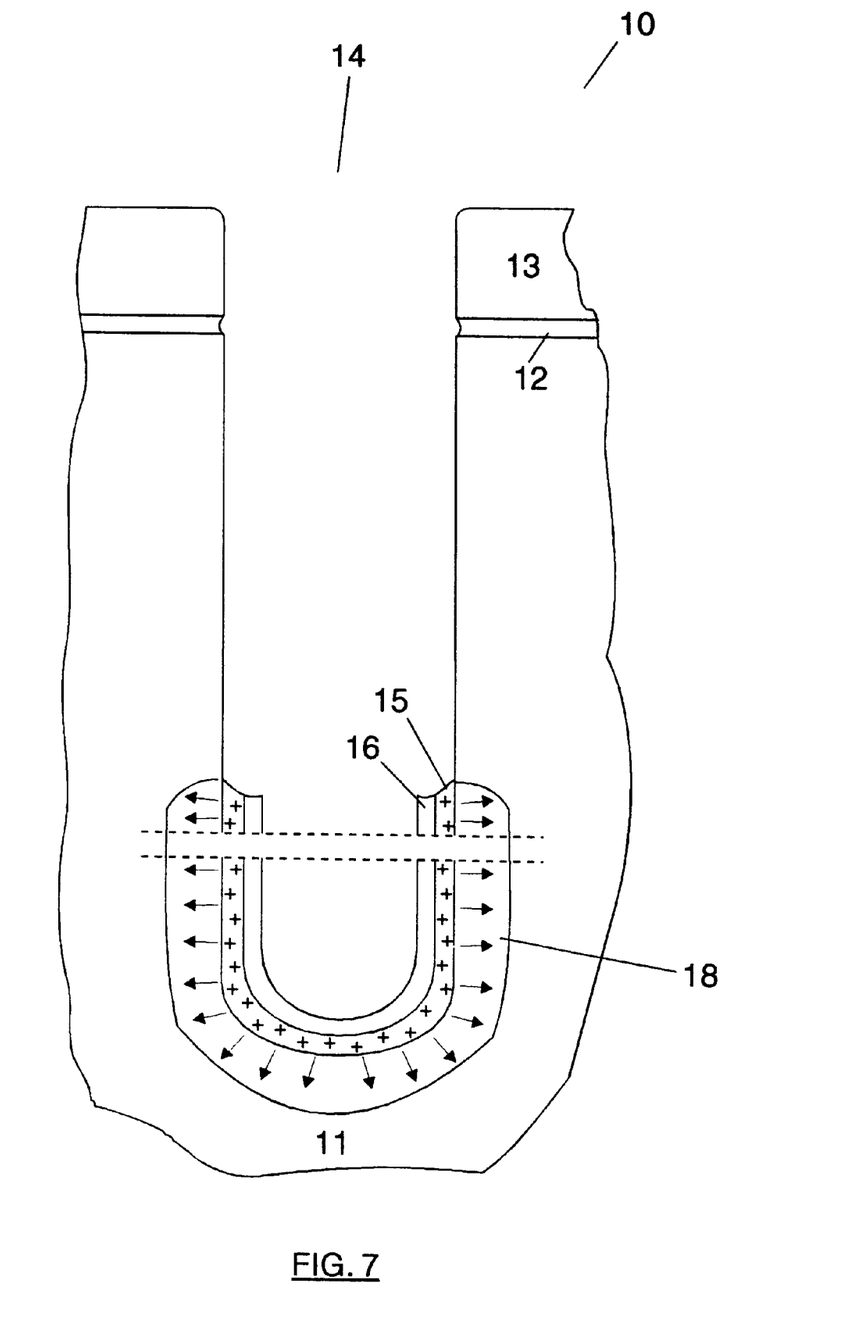

Now, the unprotected portion of the N+ arsenic-doped silicon glass and $SiO_2$ layers 15 and 16 respectively are removed by wet etching in a buffered HF bath. The resulting structure is shown in FIG. 5. Next, the resist material remaining at the bottom of deep trench 14 is stripped by wet etching in a Huang SP solution to provide the structure shown in FIG. 6. Structure 10 is then heated to allow arsenic dopant trapped in silicon glass layer 15 to diffuse into the silicon substrate 11 and create the buried plate region 18 shown in FIG. 7. The step of partially removing the photoresist material of layer 17 in deep trench 14 is essential not only to the buried plate but formation to the whole fabrication process, because the remaining photoresist determines the unprotected ASG and $SiO_2$ layers 15 and 16 to be subsequently etched and thus the size of the remaining ASG layer, which in turn defines the buried plate region 18 through the out-diffusion step. As it will be made more apparent in due course, the control of the photoresist etching described above by reference to FIG. 5 (referred to hereinbelow as the etch back step) is therefore of paramount importance.

Figure 8:
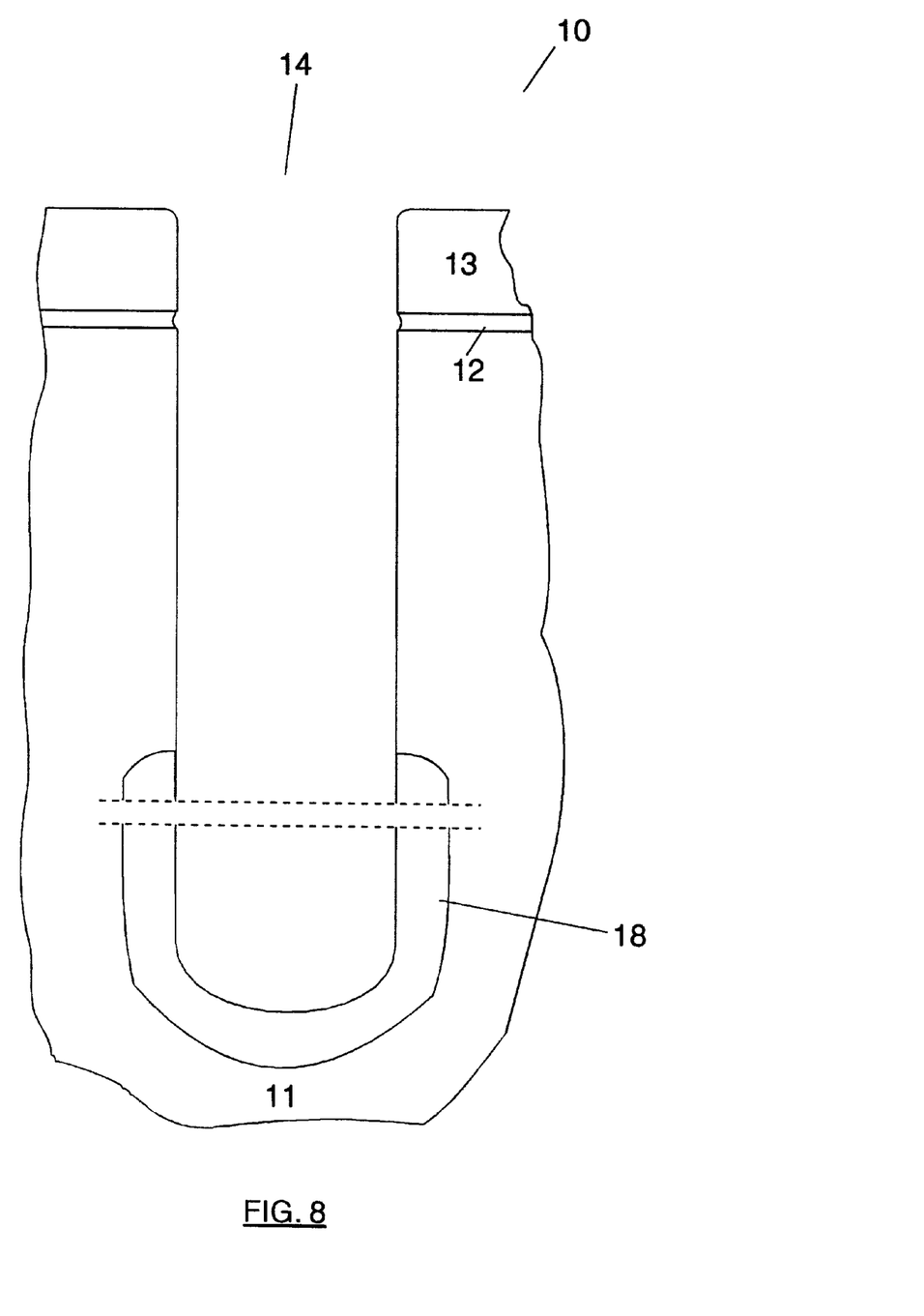
Figure 9:
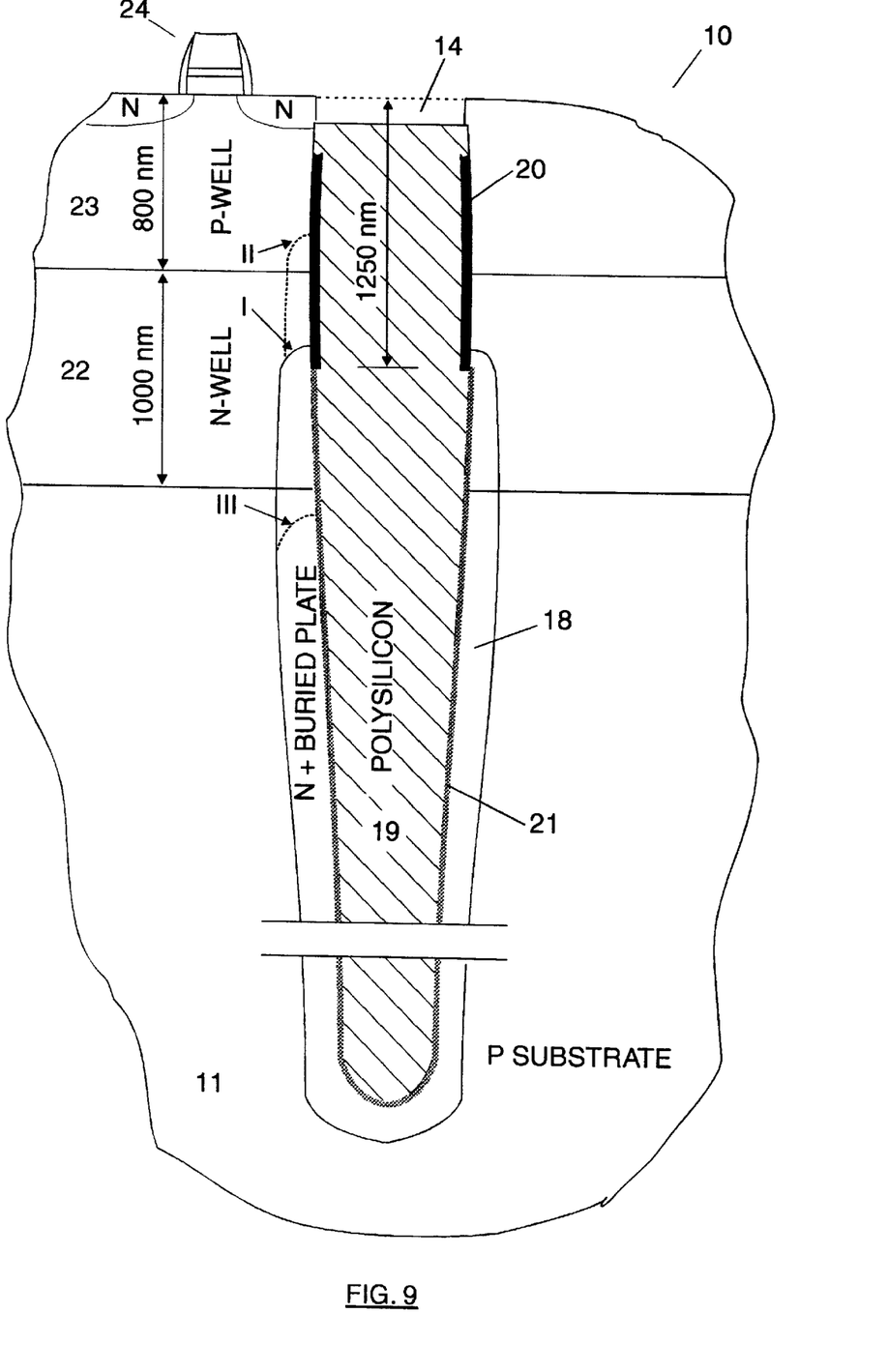
FIG. 9 shows the structure of FIG. 8 substantially at the end of the deep trench capacitor fabrication process after gate conductor stack and source/drain region formation to emphasize the critical aspects of the buried plate region formation and control thereof.

After the arsenic dopant out-diffusion step is achieved, layers 15 and 16 are removed by means of an appropriate wet etch. The final structure is shown in FIG. 8. This last step ends the buried plate formation process, but in order to understand the requirements that are specific to that process and the consequences it may have on the final structure at the end of the total fabrication process, it is necessary to consider structure 10 depicted in FIG. 8 at a much further stage. As a matter of fact, FIG. 9 shows structure 10 after gate conductor stack and source/drain regions completion.

At this stage of the fabrication process, with regard to the structure depicted in FIG. 8, the $SiO_2$ and $Si_3N_4$ pad layers 12 and 13 have been eliminated, the trench 14 is filled with doped polysilicon to form the first electrode of the storage capacitor. The polysilicon fill referenced 19 is electrically isolated from the silicon substrate 11 by a collar layer 20 on its upper part and a 5 nm thick $Si_3N_3$ layer 21 (oxidized on about a third of that thickness) on its lower part. $Si_3N_4$ layer 21 forms the dielectric film of the storage capacitor. Still very schematically, two ion implantation steps were performed to define first a 1000 nm -well 22, then a 800 nm P-well 23 embedded therein that are visible on the top of silicon substrate 11 in FIG. 9. The second electrode of the storage capacitor is thus formed by the buried plate 18 and N-well region 22. Finally, after gate conductor stack and source/drain regions formation, an IGFET 24 visible in FIG. 9 is created.

It is essential to chip reliability that the top of buried plate 18 labeled I in FIG. 9 be located below and preferably at more than 200 nm from the P-well/N-well junction to avoid parasitic vertical transistor effects. If the top of buried plate 18 extends in P-well region 23 as illustrated by profile II, a parasitic NPN transistor is then constituted by the N-type drain region of the IGFET 24, the P-well region 23 and the N+ buried plate 18. If activated, this parasitic transistor would prevent charging the storage capacitor by driving the electric charges directly to the substrate. On the other hand, it is also essential that this top is about 300 nm above the bottom of N-well region 22, because if it is below said bottom line (as illustrated by profile III), the buried plate 18 could not be biased via the N-well 22 any longer and undesired voltage breakdown would occur during storage operation. Therefore, the top of buried plate 18 must be centered at 1200 nm±200 nm from silicon substrate 11 surface. The best case is when the top of buried plate 18 slightly overlaps the bottom of collar 20 as made apparent in FIG. 9 (see profile I). If we take into account ASG wet etch and out-diffusion steps, the targeted value for resist etch will be 1500 nm±250 nm (which corresponds to the value indicated in FIG. 4).

Figure 10:
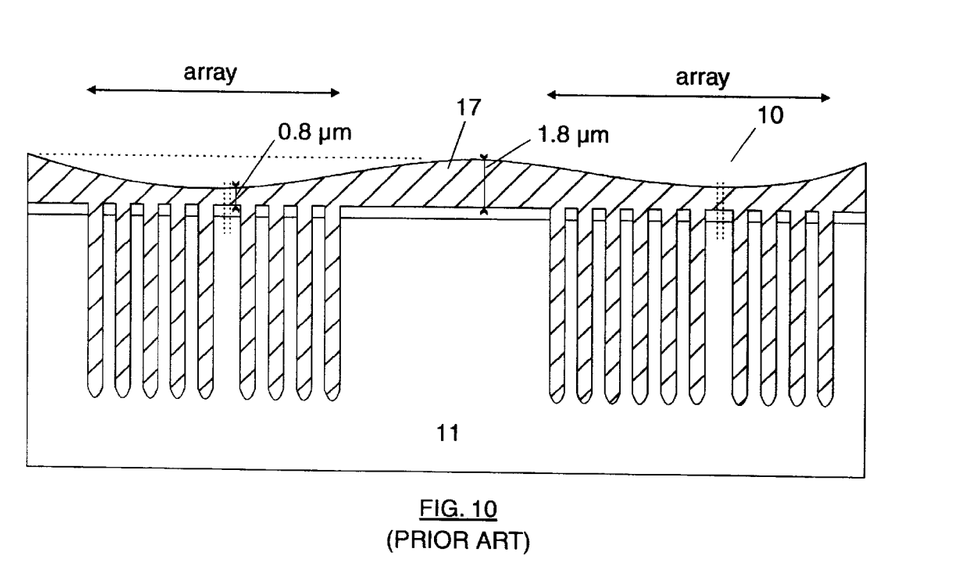
FIGS. 10 and 11 respectively show an enlarged portion of the chip after photoresist planarization and etch back steps to illustrate the variations of the photoresist layer thickness at this stage of the buried plate formation process.

Now turning to FIG. 10, let us consider the topography of structure 10 after the resist apply step described by reference to FIG. 3. In reality, the resist layer 17 surface is not planar but has rather the undulated appearance shown in FIG. 10. As apparent in FIG. 20, the resist layer 17 thickness shown a large amount of variations depending on the substrate topography. Between array areas, resist thickness is around 1800 nm, while in the middle of array areas, resist thickness is around 800 nm. Therefore, the resist thickness gradually decreases from 1.8 um down to 0.8 micron to increase again up to 1.8 um depending on the zone in consideration is located at the edge or at the center of each array. These variations are repeated a great number of times at the substrate surface.

Figure 11:
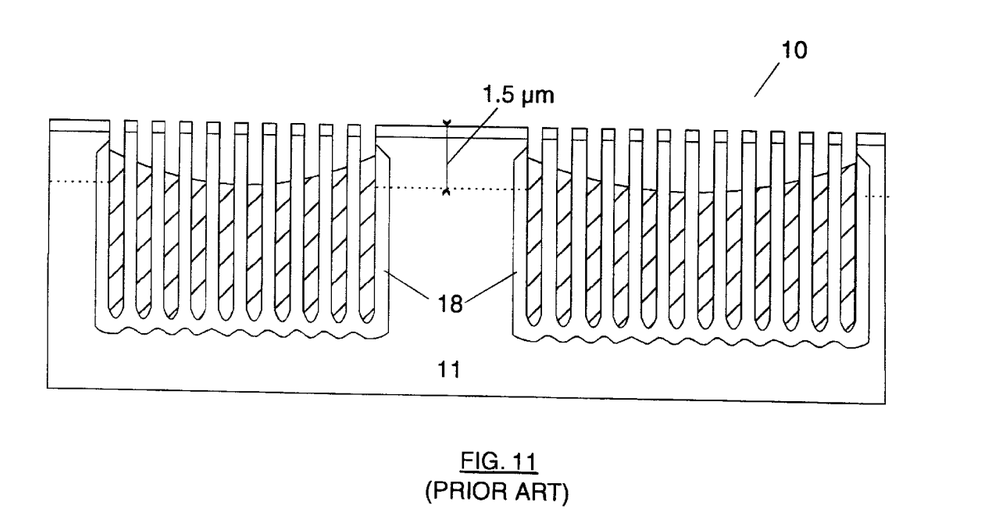

The irregular thickness of the resist material remaining in deep trenches represents a major problem for the etch back step when performed with the CDE technique, which has not any corrective capability in that respect, but on the contrary, will even detrimentally accentuate the irregularities. First of all, because of its chemical nature, it is very sensitive to the pattern at the chip surface. As a matter of fact, etch rates are lower in areas close to the array edge than at array center, so that the CDE technique tends to increase the resist thickness variations between edge and center of arrays. The real profile of the photoresist layer 17 that remains in the deep trenches of each array area after resist etch back step is rather concave-shaped as shown in FIG. 11. As a result, the desired depth of 1.5 um (necessary to obtain the desired profile labeled I in FIG. 9) can be obtained only in the center of the array and not on the edge thereof. Secondly, the CDE technique produces a poor uniformity across the wafer, typically of about 7% at 1 sigma, mainly because it is very sensitive to temperature. As a matter of fact, etch rate (about 1.5 micron per minute during photoresist etch at the substrate surface and 3 micron per minute in the deep trench) is highly variable wafer to wafer, lot to lot.

Finally, still another concern with the CDE technique is the lack of interferometric etch end-point detection. Only an optical etch end-point detection can be used to detect when the $SiO_2$ $Si_3N_4$ pad layer 12/13 is reached. But, due to large etch rate variations, it is not possible to accurately control the resist material etching in deep trenches. The buried plate formation process wherein the etch back step is achieved by the CDE technique necessitates to perform SEM cross sections for each lot to be etched in order to define the appropriate etch time and moreover requires a very accurate CDE reactor seasoning (i.e., to wait the CDE tool reaches the right operating temperature) in order to prevent too large etch rate drifts during wafer etching. It can be reminded that the other technique based upon standard resist exposure and development technique mentioned above is even worse in that regard because it is very difficult to accurately control the depth of the recess formed in the resist layer after the etch back step. In addition, this latter technique results in voids or resist remaining on top of deep trenches. However, whatever the technique used, it is extremely difficult to comply with buried plate etch specifications for a accurate control of the out-diffusion step that forms the buried plate region.

To improve the process it was determined that a replacement product to the photoresist material of layer 17 should be found, the difficulty was that such a replacement product meet a number of requirements. As a matter of fact, the selected product must:
(1) have high filling capability to fill deep trenches without voids;
(2) have high planarization capability so that after the planarization step the surface of the substrate must be as planar as possible;
(3) be perfectly adapted to the severe requirements of RIE etching with an uniform etch rate;
(4) not be attached by the etching chemistry (Huang etch) that eliminates the ASG and $SiO_2$ layers; and
(5) be easily strippable from the bottom of deep trenches after this step.

Obviously, the selected product cannot be a photoresist. Generally speaking, photoresist materials have a poor filling capability because their deposition is essentially conformal, which in turn tends to create voids in the center of the trench. Likewise, photoresist materials are usually removed by wet etching (or CDE) but substantially remain unattached by plasma or RIE etching. This is the reason why they are so commonly used as masking layers for these etching steps. According to a first essential element of the method of the present invention, a product meeting all these requirements, but essentially has high filling/planarizing capability and is etchable in a plasma is the polymer referenced ACCUFLO T-13EL manufactured by ALLIEDSIGNAL, INC., Santa, Clara, Calif., USA, which is adequate in all respects. It is a carbon-based polymer in an organic solvent which contains no silicon. It has exceptionally good flow properties for optimal planarization performance. ACCUFLO T-13EL is deposited by spin coating to provide films having a thickness in the 360 to 2000 nm range. According to the product Bulletin issued by ALLIEDSIGNAL, it has been primarily designed to be applied to a CVD oxide and then removed by plasma etching to achieve optimal planarization of the underlying C.D. oxide. This polymer thus finds extensive application in regional global planarization processes to avoid the complex and expensive chem-mech polishing (CMP) planarization.

In essence, the polymer layer is deposited by spin coating and then baked for planarization purposes to leave a layer having very smooth and planar surface above the silicon substrate. An adequate deposition tool is a TEL MARK7, manufactured by TOKYO ELECTRON LIMITED, Tokyo, Japan, equipped with a Millipose GEN II pump for polymer dispense. All the sequence of steps described below can be performed in this tool of the cluster type. The detailed process reads as follows.

First of all, an adhesion promoter such as HexaMethyl-DiSilazane (HMDS) is deposited onto the wafer by spin coating at 120 degrees C during 45 seconds. The wafer is then cooled on a cold plate at 22 degrees C during 45 seconds. Next, the wafer is put on a rotating table at 22 degrees C. Now, the process is continued with a pre-wet step with Porpylene Glycol Methyl Ether Acetate (PGMEA). Although optional, this pre-wet step is recommended because it saves a significant amount of the polymer consumption. The speed is raised to 800 rmp, then the PGMEA is dispensed at the center of the wafer during 3 seconds. The wafer is dried simply the increasing the speed to 1200 rpm for 1 second. The rotating table is accelerated up to 2500 rpm and the polymer (4.5 cc) is dispensed first at the edge (0.5 seconds), then the dispense is moved from the edge to the center of the wafer (for a 12.5 diameter wafer, this dispense step is performed in 3.5 seconds), the wafer is maintained at that speed for 2 seconds. Now, the speed is increased again to 4500 rpm with an acceleration of 2000 rpm/s. When this speed is reached, it is maintained for 60 seconds. The thickness of layer 17 is now quite uniform (equal to 1.3 um) over the whole wafer surface. The edge and backside of the wafer are cleaned (backside rinse) as standard. Finally, the spin speed is increased again to 3000 rpm for 10 seconds to dry the polymer layer at the wafer surface. The specified polymer thickness must be equal to about 1.3 um.

It is now necessary to evacuate the solvents contained in the polymer. To that end, the wafer is placed on a hot plate heated at 200 degrees C during 60 seconds while ensuring a high gas exhaust as standard. The wafer is then transferred in an oven where the wafer is heated at 200 degrees C for 180 seconds with a limited exhaust to achieve a perfect planarization. Finally, it is transferred to a cold plate at 22 degrees C for 60 seconds for cooling.

The ACCUFLO T-13EL material is then etched using an $O_2/CF_4$ chemistry. This process is performed in an AME 5000 or 5200 provided with a M×P chamber. This tool is commercially available from APPLIED MATERIAL, INC., Santa Clara, Calif., USA. It uses an electrostatic chuck referenced to as "S20" that has been specially designed to perform etching when high oxygen flows are required with high accuracy and reliability. Process parameters of this etch step are as follows:

| | |
|---|---|
| $O_2$ | 150 sccm |
| $N_2$ | 10 sccm |
| $CF_4$ | 5 scm |
| Pressure | 75 Mtorr/10 Pa |
| RF Power | 500 watt |
| Mag. Field | 9 Gauss |
| Wall temperature | 20 degrees C. |
| Cathode temperature | 55 degrees C. |
| Helium cooling press. | 26 Torr/3.5 Pa |
| Etch control | by end-point |
| Etch rate | 650 nm/min |
| Uniformity | 1.4%, at 3 sigma |
| Etch rate recess | 970 nm/min |
| Optical endpoint syst. | SOFIE MULTISEM 550 dual channel |

This RIE (Reactive Ion Etch) step is performed at low pressure. Thus, ion energy is very high and uniform. Low pressure means high mean free path, which gives a high anisotropic etch process. In these etch conditions, mechanical etch effects are higher than chemical ones. This property allows to get rid of wafer pattern effects. Etch rate is then the same whatever the location at the wafer surface: edge or center of array. Etch uniformity, less than 1.5% at 3 sigma ensures a very good photoresist depth reproducibility within a same wafer.

In addition, a dual interferometric/optical etch end-point detection system such as the MULTISEM 550 sold by SOFIE INST., Arpajon, France, is now able to monitor the etch back step. Etch rate is calculated during etch of each wafer. Optical end-point system detects when $SiO_2$ $Si_3N_4$ pad layer 12/13 is reached. Then, depending on the defined etch rate, an overetch is performed to reach the right recess depth into deep trenches. Thanks to that feature, it is now possible to thus allow an accurate process. At this stage of the novel buried plate formation process, the structure 10 is still represented by structure 10 of FIG. 4, the only difference lies in the absence of the recess at the upper portion of the layer 17 which now consists of ACCUFLO T-13EL polymer instead of the photoresist material. There is no change with the above process described by reference to FIG. 5 to remove the exposed portion of the ASG and $SiO_2$ layers 15 and 16. Finally the polymer is removed by dipping in a Huang SP etch and structure 10 that is finally obtained is such as the one represented in FIG. 6.

Figure 12:
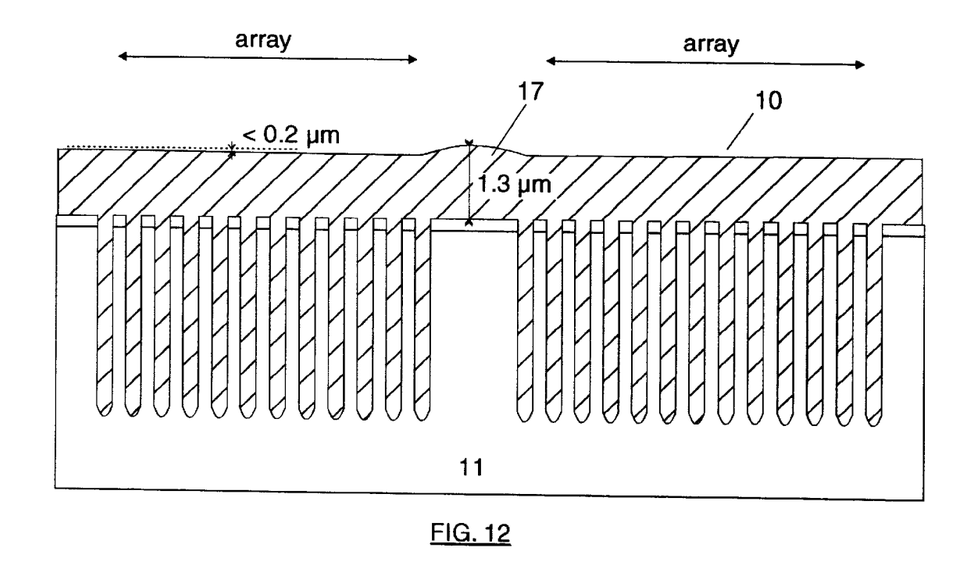
FIGS. 12 and 13 respectively show the corresponding views of FIGS. 10 and 11 when the method of the present invention is used to show that the polymer filling the deep trenches has now a planar surface after deposition/bake and etch back steps.
Figure 13:
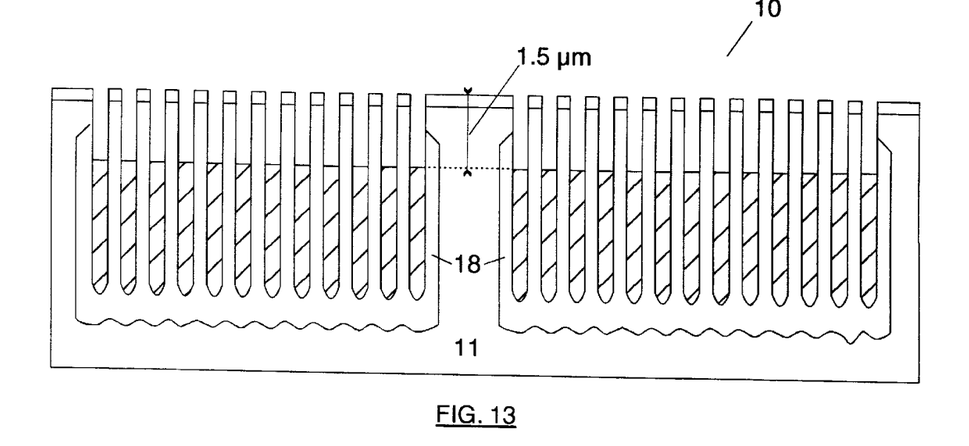

FIGS. 12 and 13 respectively show the structure 10 at the stage of FIGS. 11 and 12 when the polymer has been used according to the method of the present invention. Turning to FIG. 12, layer 17 exhibits a highly planar surface, except a slight bump at the center region between two array regions and very small undulations above array areas (now maintained within 0.2 um).

As apparent in FIG. 13, pattern effects are no longer a concern, because ACCUFLO T-13 thickness range in deep trenches between edge and center of arrays is less than 0.2 um, compared to 0.8 um for the state of the art process as illustrated by reference to FIG. 11. Buried plate region top (referenced I in the best case shown in FIG. 9) is now controlled within ±250 nm, center to edge of array within a same wafer, wafer to wafer and lot to lot. These good figures result fro the excellent uniformity that is now obtained thanks to the deposition/planarization and etch back steps when performed in accordance with the method of the present invention.

The method of the present invention offers significant advantages in terms of final test yields, cost reduction, reproducibility, reliability, uniformity and manufacturing process flow simplification.

The description of the embodiments of the present invention is given above for the understanding of the present invention. It will be understood that the invention is not to the particular embodiments described herein, but is capable of various modifications, rearrangements and substitutions will now become apparent to those skilled in the art without departing from the scope of the invention.

Therefore it is intended that the following claims cover all such modifications and changes as fall within the true spirit and scope of the invention.

What is claimed is:

1. Method of forming a buried plate region in a deep trench of a silicon substrate comprising the steps of:

a. providing a structure comprised of a silicon substrate coated by a patterned $SiO_2$ $Si_3N_4$ pad layer to define deep trenches formed therein by etching;

b. coating the interior walls of said deep trench with a N type doped glass layer and an overlying $SiO_2$ passivation layer;

c. depositing a layer of polymer dispersed in a solvent having high filling/planarizing capability and being RIE etchable to fill said deep trench in excess;

d. baking the polymer to evacuate the solvent contained therein to produce a highly planar surface;

e. RIE etching the structure to etch the polymer into the deep trench down to the desired depth;

f. removing the exposed portion of the N type doped glass layer and overlying $SiO_2$ passivation layer in said deep trench;

g. out-diffusing the N type dopant in said substrate to form the buried plate region; and h. removing the polymer remaining in said deep trench.

2. The method of claim 1 further comprising the step of:
monitoring the RIE etch step by optical/interferometric means.

3. The method of claim 1 or 2 wherein said polymer is ACCUFLO T-13EL.

4. The method of claim 3 wherein step e) is performed with an $O_2/CF_4$ chemistry.

5. The method of claim 3 wherein step c) includes the preliminary step of:
depositing a layer of an adhesion promoter such as HMDS.

6. The method of claim 5 further including the step of:
depositing a layer of a wettable material such as PGMEA onto the adhesion promoter layer.

* * * * *